(12) United States Patent
Schofield et al.

(10) Patent No.: US 6,559,784 B1
(45) Date of Patent: May 6, 2003

(54) CURRENT SWITCHING CELL FOR DIGITAL TO ANALOG CONVERTER

(75) Inventors: William G. J. Schofield, North Andover, MA (US); Douglas A. Mercer, Bradford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/042,118

(22) Filed: Nov. 21, 2001

(51) Int. Cl.[7] .................................................. H03M 1/66
(52) U.S. Cl. ....................................... 341/144; 327/108
(58) Field of Search ................................. 341/144, 110; 323/282; 327/103, 108

(56) References Cited

U.S. PATENT DOCUMENTS

| | | | |
|---|---|---|---|
| 4,761,636 A | * 8/1988 | Brokaw et al. | 341/133 |
| 5,638,011 A | * 6/1997 | Nguyen | 327/108 |
| 5,703,519 A | 12/1997 | Crook et al. | 327/387 |
| 6,377,504 B1 | * 4/2002 | Hilbert | 365/189.02 |

* cited by examiner

*Primary Examiner*—Peguy Jeanpierre
(74) *Attorney, Agent, or Firm*—Iandiorio & Teska

(57) ABSTRACT

A current switching cell for a multi-cell DAC, each cell having a data input and an analog output and including a current switching circuit having a current node; a current definition circuit for providing current to the current switching circuit at the current node; the current definition circuit having a parasitic coupling between the input and the current node; a driver circuit responsive to a data input for actuating the current switching circuit to provide an analog output from the current from the current definition circuit; and a control circuit responsive to at least one common control signal for controlling the current definition circuit and isolating the parasitic coupling between the current node and the common control signal; the driver circuit may also have a parasitic coupling between its driver input and the current node and the control circuit may isolate the parasitic coupling between the current node and the driver input.

14 Claims, 8 Drawing Sheets

CURRENT SWITCHING CELL FOR DIGITAL TO ANALOG CONVERTER

FIELD OF THE INVENTION

This invention relates to a current switching cell for a multi-cell digital to analog converter and more particularly to such a cell which is locally rather than globally controlled.

BACKGROUND OF THE INVENTION

Digital to analog converters (DAC's) employ a number of current switching cells to convert the digital inputs to analog outputs. Typically, one or more common or global lines operate the current circuits in each cell to provide a defined current to their respective current switches and another global line operates the driver circuit in each cell causing it, in response to a data input, to produce an analog output from the defined current from the current circuit. Operating these cells globally has some advantages but the common connection of these global control lines to all of the cells causes disturbance signals which result in distortion of the DAC analog output: the parasitic coupling, primarily capacitance, associated with the elements of the various circuits in each cell establish paths whereby disturbances in one circuit are propagated to others. At high frequency switching speeds the interference introduced by these disturbances not only propagates through other cells but extends in time to distort subsequent outputs of the DAC referred to as intersymbol interference. One approach to the problem has been to increase the current circuit output impedance but this results in reducing the "headroom", i.e., the amount of voltage supply to maintain the circuits in saturation.

BRIEF SUMMARY OF THE INVENTION

It is therefore an object of this invention to provide an improved current switching cell for a DAC.

It is a further object of this invention to provide such an improved current switching cell for a DAC which isolates transient disturbances and prevents them from propagating from one cell to another.

It is a further object of this invention to provide such an improved current switching cell for a DAC which reduces intersymbol interference.

It is a further object of this invention to provide such an improved current switching cell for a DAC which dramatically increases the impedance of the current circuit without decreasing the headroom.

This invention results from the realization that an improved current switching cell for a DAC which prevents propagation of disturbances of parasitic capacitance or other parasitic couplings which distort the DAC output and cause intersymbol interference can be achieved by isolating the parasitic couplings from the common or global control lines to the current circuit and driver circuit of each cell so that the disturbances can not pass from one cell to another.

This invention features a current switching cell for a multi-cell DAC, each cell having a data input and an analog output. There is a current switching circuit having a current node and a current definition circuit for providing current to the current switching circuit at the current node. The current definition circuit has a parasitic coupling between its input and the current node. A driver circuit responsive to a data input, actuates the current switching circuit to provide an analog output from the current definition circuit. A control circuit responds to at least one common control signal for controlling the current definition circuit and isolating the parasitic coupling between the current node and the common control signal.

In the preferred embodiment the current switching circuit may include a differential current switching circuit. The current definition circuit may include a current source and the current source may be connected to the current node. The differential switching circuit may include FET's and the current node may be a common source current node. The current definition circuit may include a cascode circuit in series with the current source and the cascode circuit may be connected to the current node. The parasitic coupling may include a parasitic capacitance. The cascode circuit may include an active cascode circuit. The control circuit may define the current supplied by the current source and the impedance of the current definition circuit. The control circuit may include a buffer amplifier. The current switching circuit, current definition circuit, driver circuit, and control circuit may be implemented with FET's. The control circuit may be responsive to two common control signals, a first common control signal which defines the current supplied by the current source, and a second common control signal which operates the cascode circuit to multiply the impedance of the current source.

The invention also features a current switching cell for a multi-cell DAC each cell of which has a digital input and analog output. There is a current switching circuit having a current node and a current definition circuit providing current to the current switching circuit at the current node. A driver circuit responds to a data input to provide a driver input to the current switching circuit to enable it to produce an analog output from the current from the current definition circuit. The driver circuit has a parasitic coupling between its driver input and the current node. A control circuit responsive to a common control signal controls the driver circuit and isolates the parasitic coupling between the current node and the driver input.

In a preferred embodiment the parasitic coupling may include a parasitic capacitance.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
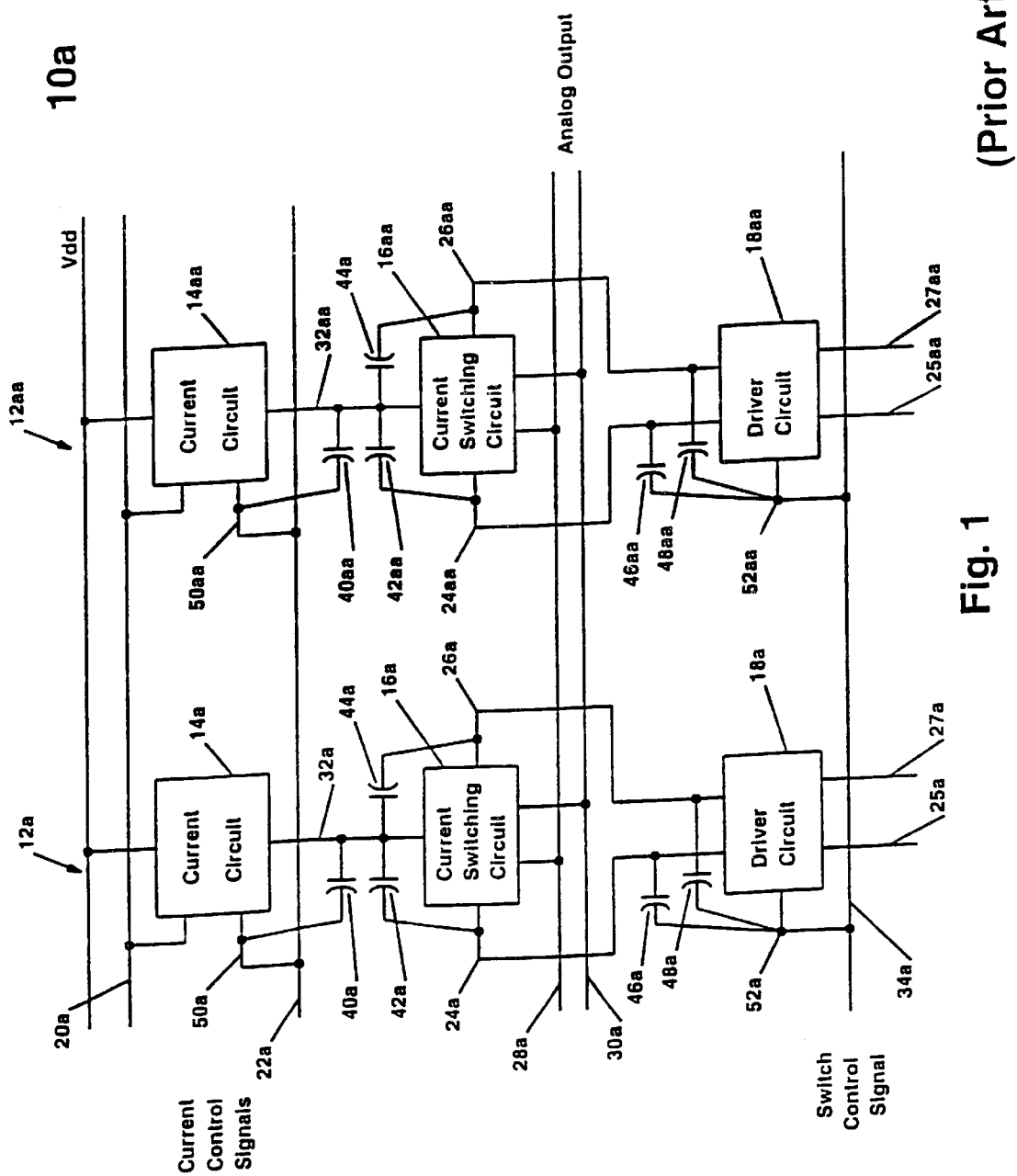
FIG. 1 is a schematic block diagram showing a portion of a prior art DAC including two current switching cells.

There is shown in FIG. 1 a portion of a DAC 10a including current switching cells 12a and 12aa which are but two of a multiplicity of such cells that make up the DAC. Reference is made only to cell 12a for illustrative purposes; cell 12aa uses the same numbers accompanied by two lower case a's. Current switching cell 12a includes current circuit 14a, current switching circuit 16a, and driver circuit 18a which has digital inputs 25a and 27a. Current circuit 14a receives control signals on global or common lines 20a and 22a which service all of the current circuits, 14a, 14aa . . . . Current switching circuit 16a is operated by driver circuit 18a over drive lines 24a and 26a to provide analog outputs on lines 28a and 30a derived from the current supplied at current node 32a from current circuit 14a. Driver circuit 18a is operated by a switch control signal on another global control line 34a. Control line 20a may define the current provided by current circuit 14a while control line 22a may control the output impedance of current circuit 14a. A problem with these prior art circuits is that disturbances that occur in any one of the circuits 14a, 14aa . . . , 16a, 16aa . . . , 18a, 18aa . . . , can propagate to any of the others through the connection of the global control line because of the parasitic couplings that occur in the circuits themselves.

In FIG. 1 the parasitic couplings are shown as parasitic capacitances. For example, a parasitic capacitance 40a extends between current node 32a and the input to current circuit 14a from control line 22a. Current switching circuit 16a experiences two parasitic couplings capacitances 42a and 44a between current node 32a and the driver outputs 24a and 26a. And driver circuit 18a experiences parasitic coupling in the form of capacitances 46a and 48a between driver outputs 24a and 26a and the global control line 34a. Thus, for example, a disturbance appearing at current node 32a is propagated through parasitic capacitance 40a and input line 50a of current circuit 14a onto the global control line 22a where it then passes through input 50aa into current circuit 14aa and subsequent circuits in line. From input 50aa it goes directly through current circuit 14aa to the node 32aa.

In a similar fashion, disturbances at current node 32a can pass through parasitic capacitances 42a and 44a, depending upon the condition of current switching circuit 16a, through the associated ones of driver outputs 24a and 26a and their respective parasitic capacitances 46a and 48a, and through the input 52a of driver circuit 18a onto global control line 34a. From there the disturbances can be transmitted in the same way, through the same paths on the other cells in the system, for example, in cell 12aa the disturbance can pass through input 52aa, capacitances 46aa and 48aa, driver outputs 24aa and 26aa, and capacitances 42aa and 44aa to current node 32aa.

Figure 2:
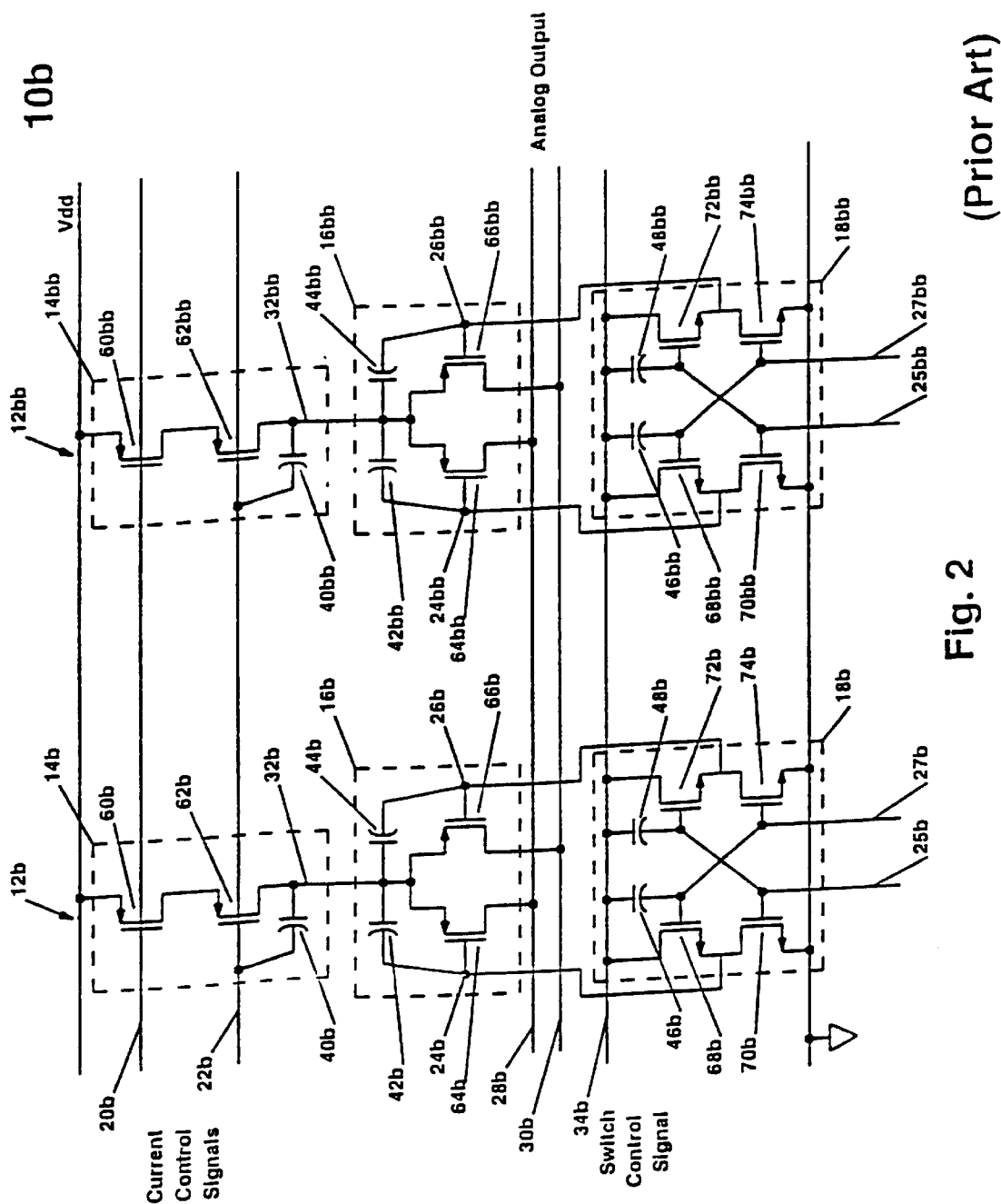
FIG. 2 is a more detailed view of the prior art circuits of FIG. 1.

The prior art construction of DAC 10a is shown in FIG. 2 wherein all of the transistors are implemented as field effect transistors (FET's) and current circuit 14b includes a first FET operating as a current source 60b and a second acting as a cascode circuit 62b. Current switching circuit 16b is implemented in FIG. 2 as a differential current switch employing two FET's 64b and 66b and driver circuit 18b is implemented in a differential mode using FET transistors 68b, 70b, 72b and 74b.

Figure 3:
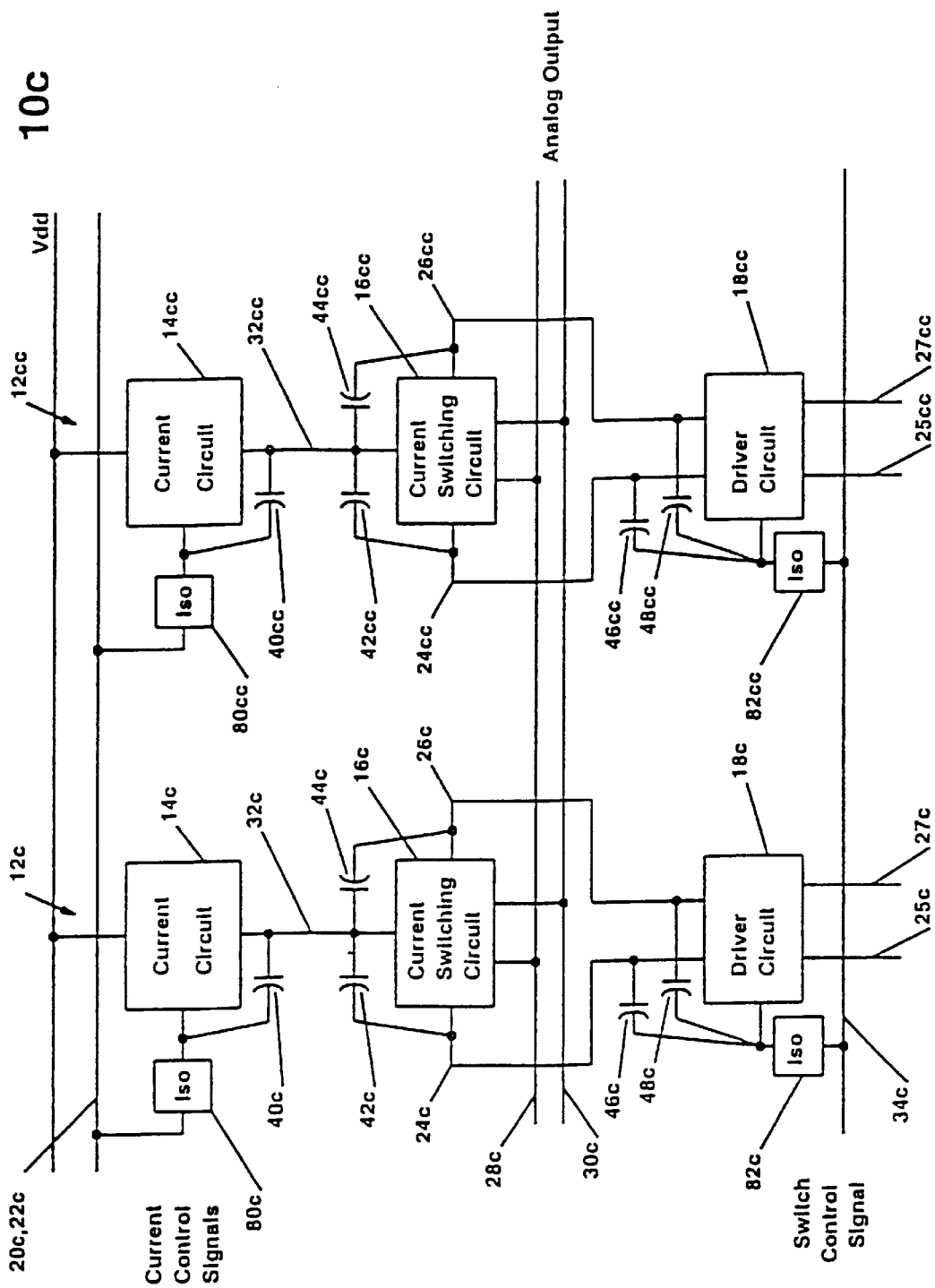
FIG. 3 is a schematic block diagram similar to FIG. 1 of DAC current switching cells according to this invention.

In accordance with this invention, DAC 10c, FIG. 3, includes cells 12c and 12cc which include a current definition circuit 14c, current switching circuit 16c, and driver circuit 18c. The global control signals are no longer delivered directly to current definition circuit 14c. Rather, they are first transmitted to isolation circuit 80c in order to isolate the parasitic coupling capacitance 40c from the global connection line 20c and 22c. In that way disturbances which occur on one or both of those line will not be propagated to the current node 32c as explained previously. Similarly, isolation circuit 82c is interposed between global control line 34c and driver circuit 18c to prevent disturbances on control line 34c from passing through either parasitic capacitances 46c and 42c or 48c and 44c which interconnect with current node 32c.

Figure 4:
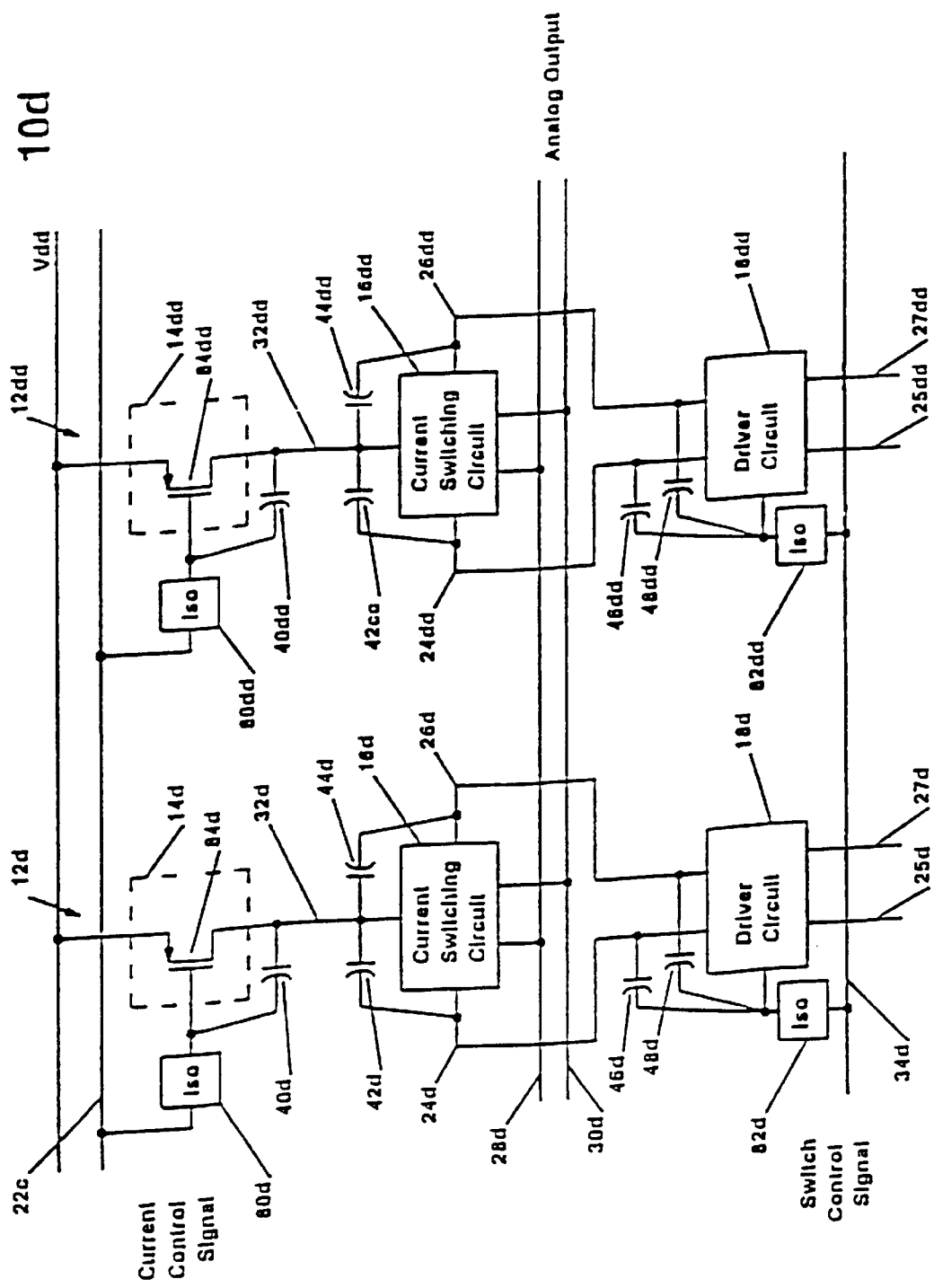
FIG. 4 is a view similar to FIG. 3 showing one implementation of the current definition circuit in greater detail.
Figure 6:
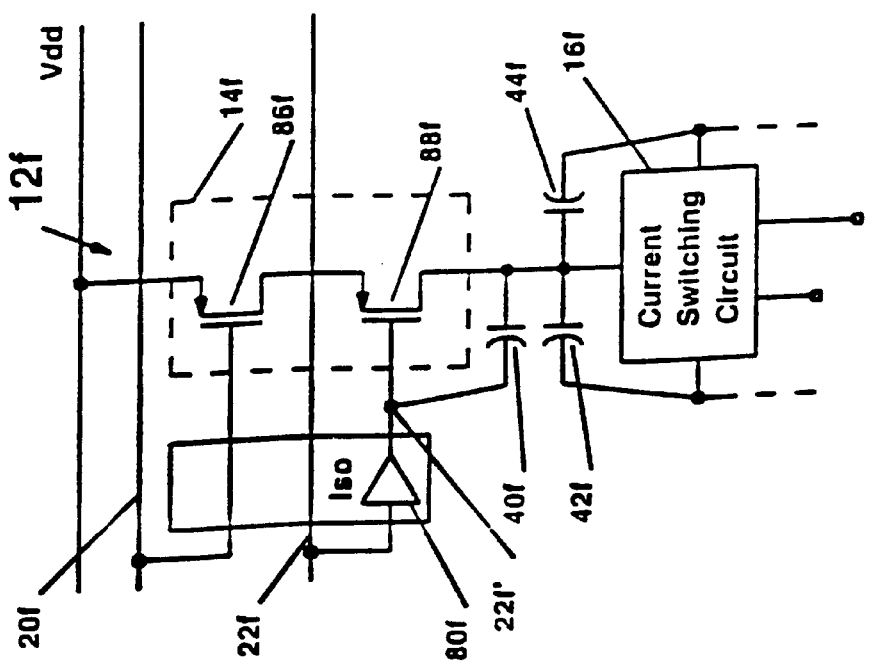
FIG. 6 is a schematic block diagram of another construction of the current definition circuit of FIG. 4.
Figure 5:
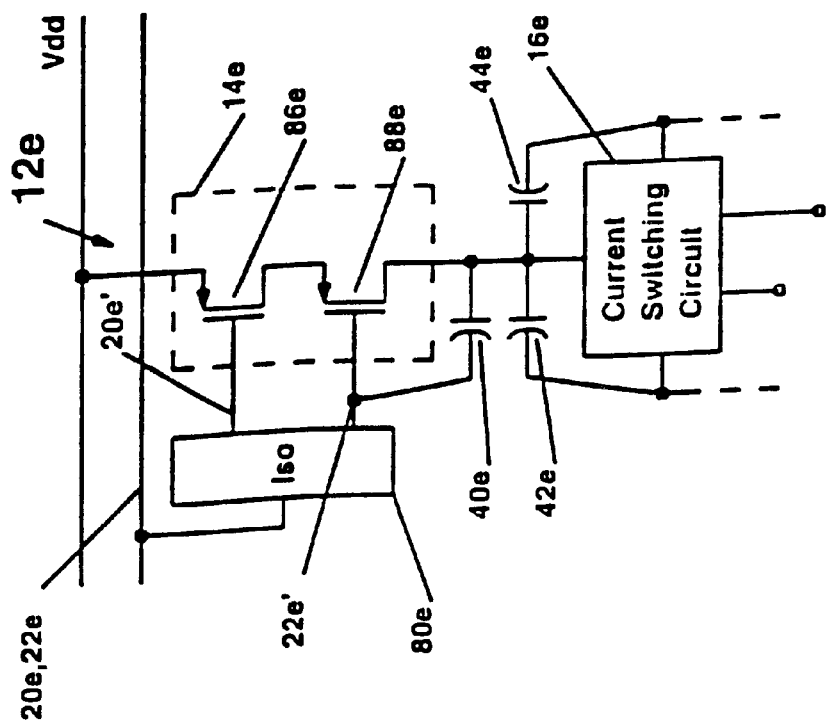
FIG. 5 is a schematic block diagram of another construction of the current definition circuit of FIG. 4.
Figure 8:
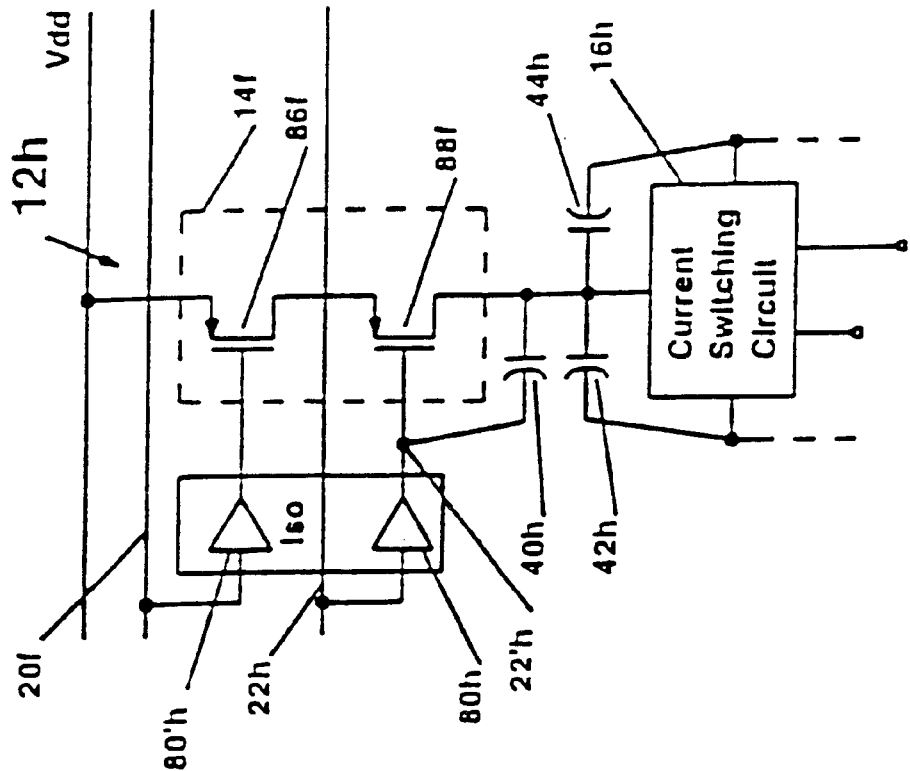
FIG. 8 is a schematic block diagram of another construction of the current definition circuit of FIG. 4.
Figure 7:
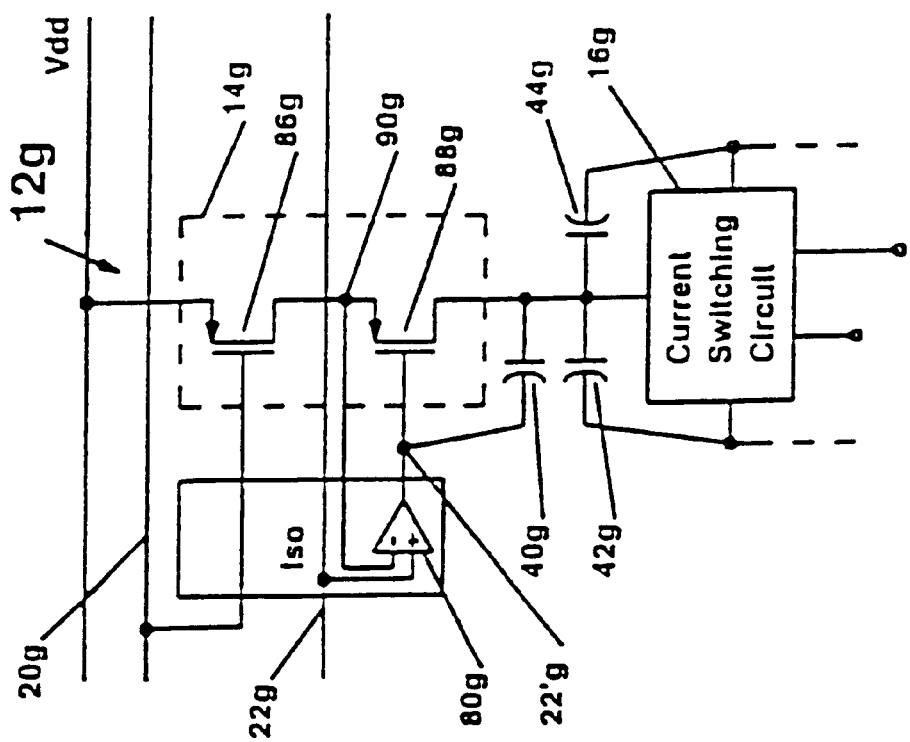
FIG. 7 is a schematic block diagram of another construction of the current definition circuit of FIG. 4.

In one embodiment in accordance with this invention, the current definition circuit 14d, FIG. 4, includes a current source 84d implemented with an FET with its drain connected to current node 32d. In another embodiment as shown in FIG. 5, in cell 12e, current definition circuit 14e includes current source 86e and cascode circuit 88e, both implemented with FET's. Here isolation circuit 80e receives global input 20e and 22e and delivers two outputs, 20e' and 22e' to the current source 86e and the cascode circuit 88e, respectively. In this way the current supplied by current source 86e is defined and the impedance of current source 86e is mulitplied by the gain factor of cascode circuit 88e. Alternatively, current control signal 20f, FIG. 6 and impedance control signal 22f can be separately supplied over global lines with the control signal fed directly to current source 86f while the impedance control signal is first delivered to isolation circuit 80f before it is delivered to the cascode circuit 88f. While cascode circuit 88f is shown as a conventional cascode circuit this is not a necessary limitation of the invention as it may be implemented with an active cascode circuit 88g, FIG. 7, wherein the isolator circuit 80g receives feedback on line 90g from the cascode circuit 88g. In this circuit the output impedance of current source 86g is increased not just by the cascode circuit but by the combination of the gain of the cascode circuit and the gain of the isolation circuit 80g. Another variation is depicted in FIG. 8 where in contrast to cell 12f in FIG. 6, cell 12h includes an isolation circuit 80h and 80h' associated with cascode circuit 88h and current source 86h, respectively, so that each is independently isolated from its global control signal 20h and 22h, respectively.

Figure 9:
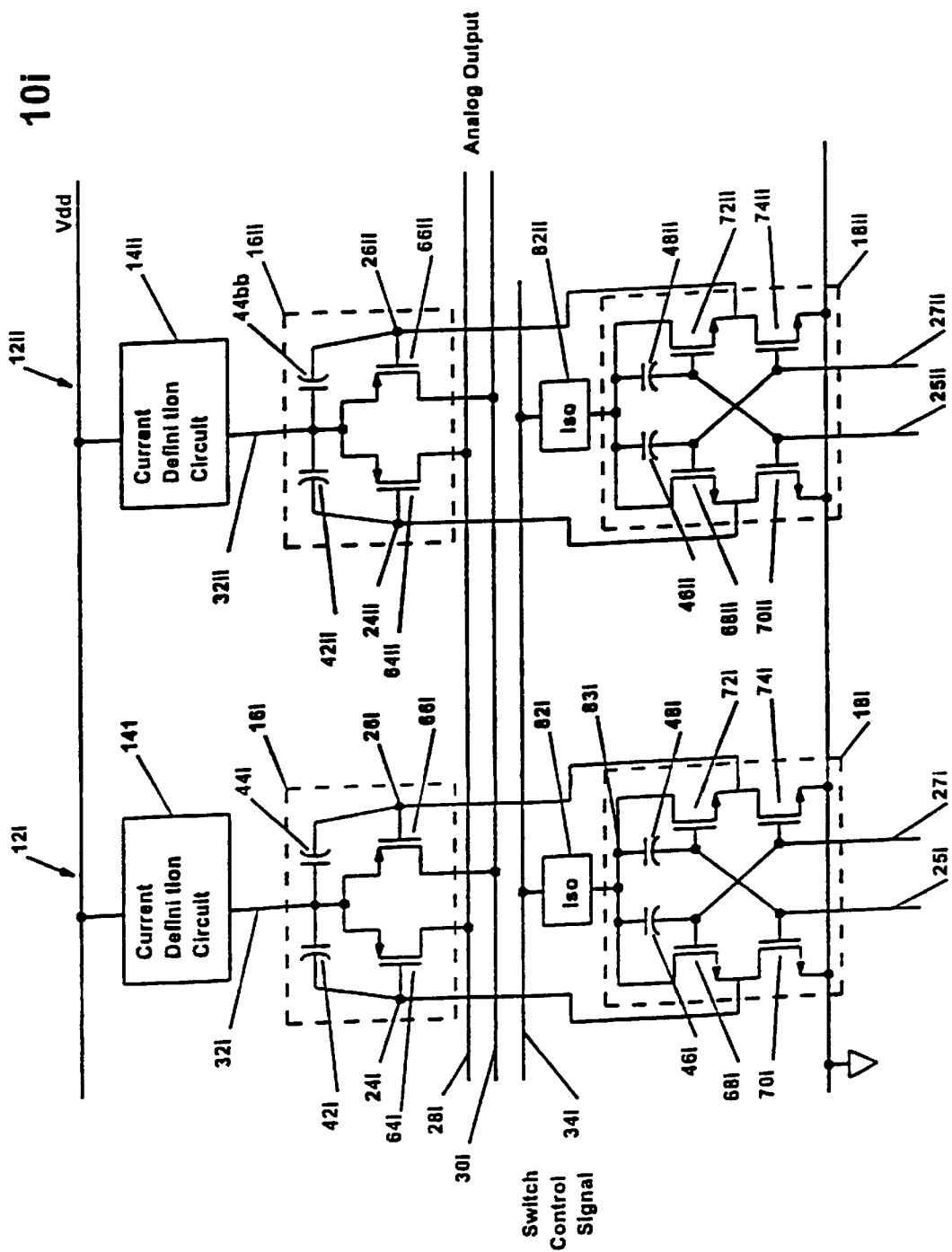
FIG. 9 is a schematic block diagram similar to FIG. 3 showing the current switching circuit and driver circuit in greater detail to illustrate the isolation circuit applied to the driver circuit.
Figure 10:
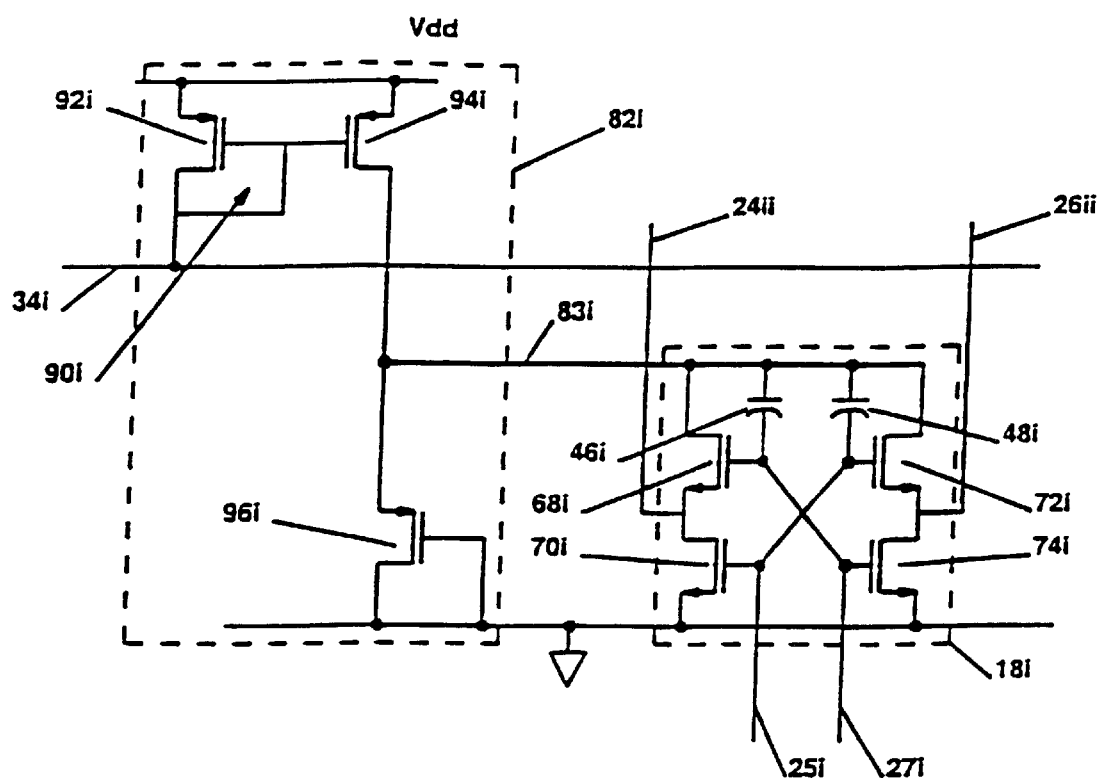
FIG. 10 is a more detailed schematic diagram of one implementation of the isolation circuit of FIG. 9.

The use of an isolating circuit to isolate the parasitic coupling capacitances 42i and 44i, FIG. 9, associated with current switching circuit 16i can also be eliminated by the use of isolation circuit 82i where node 83i connects isolation circuit 82i and driver circuit 18i. (In FIG. 9 the detail associated with current definition circuits 14i has been eliminated for clarity.) In this way, without isolation circuit 82i any disturbance appearing on control line 34i could propagate through whichever the switches 68i or 72i is on in switch driver 18i and from there be transmitted to the gates of the respective one of transistors 64i and 66i and then through the respective ones of parasitic capacitances 42i and 44i to current node 32i. Isolation circuit 82i in one construction, FIG. 10, includes current mirror 90i including FET's 92i and 94i and diode connected FET transistor 96i. Any disturbance introduced by the digital input 25i and 27i, appearing at node 83i will be isolated by current mirror 90i from reaching control line 34i and propagating to other cells in the DAC while diode connected transistor 96i maintains the proper voltage from node 83i to ground so that the proper operating voltage is present on switch driver 18i.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A current switching cell for a multi-cell DAC, each said cell having a data input and an analog output comprising:
    a current switching circuit having a current node;
    a current definition circuit for providing current to said current switching circuit at said current node; said current definition circuit having a parasitic coupling between its input and said current node;
    a driver circuit responsive to a data input for actuating said current switching circuit to provide an analog output from the current from said current definition circuit; and
    a control circuit responsive to at least one common control signal for controlling said current definition circuit and isolating said parasitic coupling between the current node and said common control signal.

2. The current switching cell of claim 1 in which said current switching circuit includes a differential current switching circuit.

3. The current switching cell of claim 2 in which said differential current switching circuit includes FET's and said current node is a common source current node.

4. The current switching cell of claim 1 in which said current definition circuit includes a current source and said current source is connected to said current node.

5. The current switching cell of claim 4 in which said control circuit defines the current supplied by said current source.

6. The current switching cell of claim 1 in which said current definition circuit includes a cascode circuit in series with a current source and said cascode circuit is connected to said current node.

7. The current switching cell of claim 6 in which said cascode circuit includes an active cascode circuit.

8. The current switching cell of claim 6 in which said control circuit defines the current supplied by said current source and the impedance of said current definition circuit.

9. The current switching cell of claim 6 in which said control circuit is responsive to two common control signals, a first common control signal which defines the current supplied by said current source and a second common control signal which operates said cascode circuit to multiply the impedance of said current source.

10. The current switching cell of claim 1 in which said parasitic coupling includes a parasitic capacitance.

11. The current switching cell of claim 1 which said control circuit includes a buffer amplifier.

12. The current switching cell of claim 1 in which said current switching circuit, current definition circuit, driver circuit, and control circuit are implemented with FET's.

13. A current switching cell for a multi-cell DAC, each said cell having a data input and an analog output comprising:
    a current switching circuit having a current node;
    a current definition circuit for providing current to said current switching circuit at said current node;
    a driver circuit responsive to a data circuit to provide a driver input to said current switching circuit to enable it to produce an analog output from the current from said current definition circuit, said driver circuit having a parasitic coupling between its driver input and said current node; and
    a control circuit responsive to a common control signal for controlling said driver circuit and isolating said parasitic coupling between the current node and said driver input.

14. The current switching cell of claim 13 in which said parasitic coupling includes a parasitic capacitance.

* * * * *